United States Patent
Lee et al.

(10) Patent No.: US 8,036,045 B2
(45) Date of Patent: Oct. 11, 2011

(54) DATA OUTPUT CONTROL CIRCUIT

(75) Inventors: Joo Hyeon Lee, Bucheon-si (KR); Yin Jae Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 504 days.

(21) Appl. No.: 12/315,025

(22) Filed: Nov. 26, 2008

(65) Prior Publication Data

US 2009/0327524 A1    Dec. 31, 2009

(30) Foreign Application Priority Data

Jun. 27, 2008   (KR) .................. 10-2008-0061908

(51) Int. Cl.
  *G11C 7/10* (2006.01)
(52) U.S. Cl. ................ 365/189.02; 365/189.05
(58) Field of Classification Search ............. 365/189.02, 365/189.05, 230.03
  See application file for complete search history.

(56) References Cited

U.S. PATENT DOCUMENTS

| 5,877,987 | A  | * | 3/1999 | Merritt ................. 365/189.05 |
| 6,895,465 | B2 |   | 5/2005 | Hashimoto et al. |
| 7,061,941 | B1 | * | 6/2006 | Zheng ..................... 370/535 |
| 7,349,287 | B2 |   | 3/2008 | Murata et al. |
| 2007/0133313 | A1 | * | 6/2007 | Kim .................. 365/189.05 |

FOREIGN PATENT DOCUMENTS

| KR | 10-2007-0036604 A | 4/2007 |
| KR | 10-2008-0100647   | 11/2008 |

* cited by examiner

*Primary Examiner* — Anh Phung
(74) *Attorney, Agent, or Firm* — John P. White; Cooper & Dunham LLP

(57) ABSTRACT

A data output control circuit in a semiconductor memory device includes a driving signal generating unit configured to decode first and second I/O mode signals and first and second address level signals in response to a bank active signal and generate driving signals, and a data output multiplexing unit configured to output data signals of global I/O lines as multiplexing signals in response to the driving signals.

18 Claims, 5 Drawing Sheets

DATA OUTPUT CONTROL CIRCUIT

TECHNICAL FIELD

The present invention relates to a semiconductor memory device and, more particularly, to a data output control circuit in the semiconductor memory device.

BACKGROUND

Generally, the trend in electronic components is to process the data with low-power consumption, high performance and high-capacity. The fact is that the user's commands for the high-capacity data processing provoke an increment in power consumption of the electronic device.

To process a huge amount of data at once, the capacity of the input and output buffers, which corresponds to such a huge amount of data, is to be increased. Further, since the data output device of the semiconductor memory has data bus structures such as X8, X16, X32 and so on, the data output device is given a great deal of weight on the amount of power consumption.

Meanwhile, the memory manufacturer designs a scheme capable of supporting all of the data bus structures of X8, X16 and X32 and makes the memory device operate in one of input/output (I/O) modes of X8, X16 and X32 through an option treatment based on the user's demand.

In order to achieve this operation features, the memory device has a data output multiplexer and the data output multiplexer transfers data on global I/O lines (GIO) to a pipe line latch according to address Information and the I/O modes of X8, X16 and X32.

FIG. 1 is a block diagram Illustrating a conventional data output control circuit and FIG. 2 is a circuit diagram illustrating a decoder shown in the conventional data output control circuit of FIG. 1.

Referring to FIG. 1, the conventional data output control circuit includes a decoder 1, which produces driving signals LAY9C<0:3> in response to address level signals AT9 and AT12, and a data output multiplexer 2 which transfers data on global I/O lines to a pipe line latch circuit (not shown) in response to the driving signals LAY9C<0:3>.

Referring to FIG. 2, the decoder 1 decodes the address level signals AT9 and AT12 and produces the driving signals LAY9C<0:3> to drive the data output multiplexer 2. That is, the conventional data output control circuit enables one of the driving signals LAY9C<0:3> to a high level, regardless of a bank active operation.

Accordingly, the conventional data output control circuit has a problem in that current consumption is caused when the data on the global I/O lines are transmitted because the data output multiplexer in a nonselective bank is driven.

SUMMARY

In an aspect of the present disclosure, a data output control is provided that is capable of preventing unnecessary current consumption from being caused when the data on the global I/O lines are transmitted, by producing a driving signal for a data output multiplexing unit in response to a bank active signal.

In an embodiment, a data output control circuit includes a driving signal generating unit configured to decode first and second I/O mode signals and first and second address level signals and generate driving signals, wherein the driving signal generating unit is driven by a bank active signal, and a data output multiplexing unit configured to output data signals of global I/O lines as multiplexing signals in response to the driving signals.

The driving signal generating unit can include an I/O mode setup unit configured to set up voltage levels on first and second nodes according to the first and second I/O mode signals, and a driving signal output unit configured to decode the first and second address level signals and the voltage levels on the first and second nodes and output the driving signals, wherein the driving signal output unit is driven by the bank active signal.

The I/O mode setup unit can include a first node setup unit configured to set up the voltage level on the first node by performing a logic summation of the first I/O and second mode signals, wherein the voltage level on the second node is set up to a voltage level of the second I/O mode signal.

The driving signal output unit can include a first operation unit to perform a NAND operation of the first address level signal and a voltage level signal of the first node, a second operation unit to perform a NAND operation of an output signal of the first operation unit and the voltage level signal of the first node, a third operation unit to perform a NAND operation of the second address level signal and a voltage level signal of the second node, a fourth operation unit to perform a NAND operation of an output signal of the third operation unit and the voltage level signal of the second node, and a decoding unit for outputting the driving signals by decoding the output signals of the first to fourth operation units in response to the bank active signal.

The decoding unit can be disabled when the bank active signal is disabled.

The data output multiplexing unit can include a plurality of multiplexers to output the data signals of the global I/O lines as a plurality of multiplexing signals in response to the driving signals.

In another embodiment, a data output control circuit includes an address level signal output unit configured to output first and second address level signals based on first and second address signals, an I/O mode setup unit configured to set up voltage levels of first and second nodes in response to I/O mode signals, a driving signal output unit configured to decode the first and second address level signals and the voltage levels of the first and second nodes and generate driving signals, wherein the driving signal output unit is driven by a bank active signal, and a data output multiplexing unit configured to output data signals of global I/O lines as multiplexing signals in response to the driving signals.

The address level signal output unit can include a first transfer unit to transfer the first and second address signals in response to a first signal, a latch unit to latch an output signal of the first transfer unit, a delay unit to delay an output signal of the latch unit, and a second transfer unit to transfer an output signal of the delay unit or the output signal of the latch unit in response to a write enable signal.

The first signal can be a voltage level signal which is activated during a column operation of a corresponding bank.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, embodiments of the present disclosure will be described with reference to accompanying drawings. However, the examples and embodiments are for Illustrative purposes only and are not intended to limit the scope of the Invention.

Figure 1:
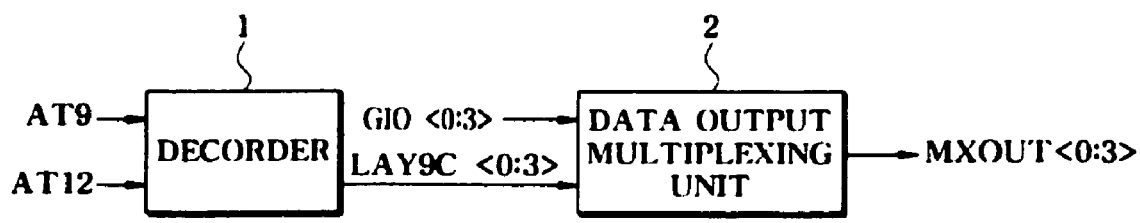
FIG. 1 is a block diagram illustrating a conventional data output control circuit.
Figure 2:
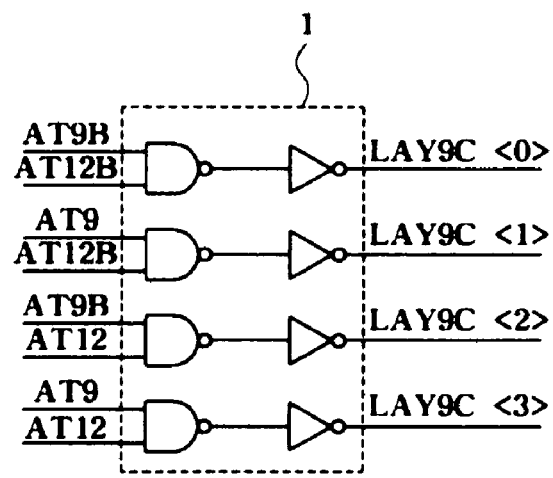
FIG. 2 is a circuit diagram illustrating a decoder in the conventional data output control circuit of FIG. 1.
Figure 3:
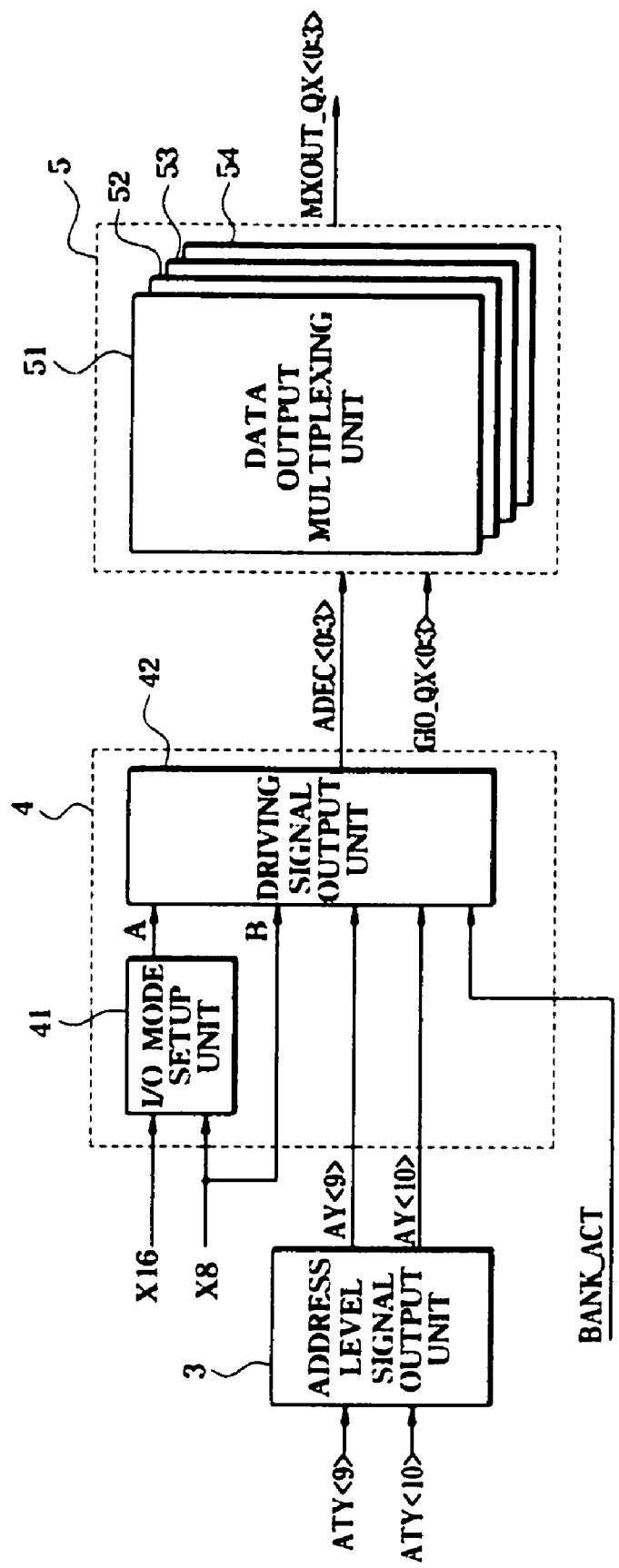
FIG. 3 is a block diagram illustrating an example of a data output control circuit according to the present disclosure.

FIG. 3 is a block diagram illustrating an example of a data output control circuit according to the present disclosure.

Referring to FIG. 3, the data output control circuit according to the present disclosure includes an address level signal output unit 3, a driving signal generating unit 4, and a data output multiplexing unit 5. The address level signal output unit 3 outputs address level signals AY<9> and AY<10> based on address signals ATY<9> and ATY<10>. The driving signal generating unit 4 generates driving signals ADEC<0:3> in response to I/O mode signals of X8 and X16 and the address level signal AY<9>. Operation of the driving signal generating unit 4 is determined based on a bank active signal BANK_ACT. The data output multiplexing unit 5 outputs data signal GIO_QX<0:3> on a global I/O line as multiplexing signal MXOUT_QX<0:3> in response to the driving signals ADEC<0:3>.

Figure 4:
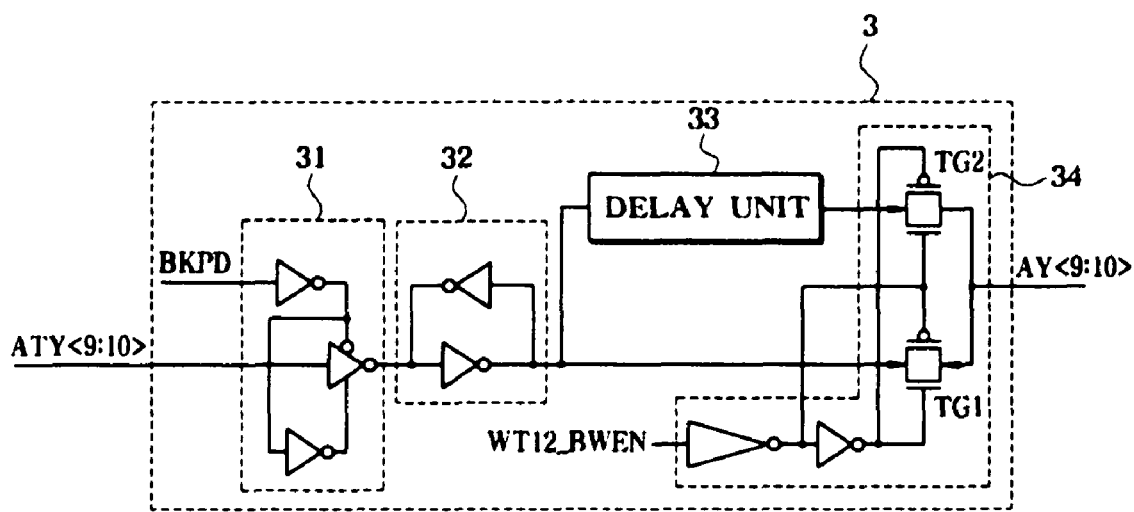
FIG. 4 is a circuit diagram illustrating an example of an address level signal output unit In the data output control circuit of FIG. 3.

FIG. 4 is a circuit diagram illustrating an example of configuration of the address level signal output unit 3 shown in FIG. 3.

Referring to FIG. 4, the address level signal output unit 3 includes a first transfer unit 31 to transfer the address signals ATY<9> and ATY<10> in response to a first signal BKPD, a latch unit 32 to latch an output signal of the first transfer unit 31, a delay unit 33 to delay an output signal of the latch unit 32, and a second transfer unit 34 to transfer an output signal of the delay unit 33 or the output signal of the latch unit 32, in response to a write enable signal WT12_BWEN. The first signal BKPD is a voltage level signal which is activated during a column operation of a corresponding bank.

The first transfer unit 31 transfers the address signals ATY<9> and ATY<10> when the first signal BKPD is enabled. The latch unit 32 latches the output signal of the first transfer unit 31 and changes the latched signals into a voltage level signal.

The second transfer unit 34 outputs the output signal of the latch unit 32 through a first transfer gate TG1 when the write enable signal WT12_BWEN is enabled and outputs the output signal of the delay unit 33 through a second transfer gate TG2 when the write enable signal WT12_BWEN is disabled.

That is, the output signal of the latch unit 32 is directly output at the time of write operation, but it is output through the delay unit 33 at the time of read operation. Since the read and write operations are different from each other in data margins, the address signals ATY<9> and ATY<10> are respectively output as the address level signals AY<9> and AY<10> through different signal paths according to the read or write operation.

This address level signal output unit 3 includes a first address level signal output unit to output the address signal ATY<9> as the address level signal AY<9> and a second address level signal output unit to output the address signal ATY<10> as the address level signal AY<10>.

Figure 5:
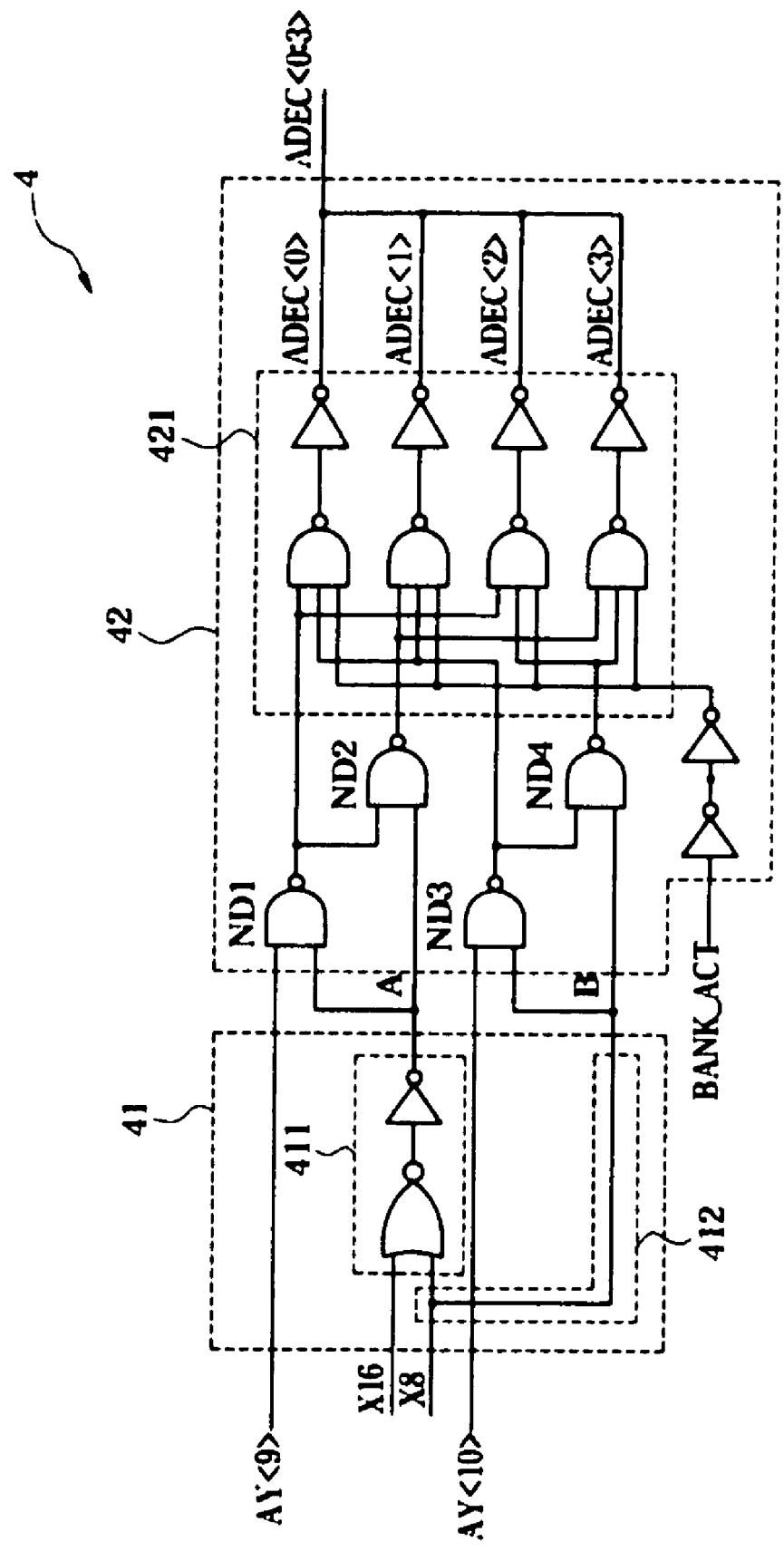
FIG. 5 is a circuit diagram illustrating an example of a driving signal generating unit in the data output control circuit of FIG. 3.

FIG. 5 is a circuit diagram Illustrating an example of configuration of the driving signal generating unit shown in FIG. 3.

Referring to FIGS. 3 and 5, the driving signal generating unit 4 includes an I/O mode setup unit 41 to set up voltage levels of first and second nodes A and B in response to the I/O mode signals of X8 and X6, and a driving signal output unit 42 to output the driving signals ADEC<0:3> in response to the address level signals AY<9> and AY<10> and the voltage levels of the first and second nodes A and B. Operation of the driving signal output unit 42 is determined based on the bank active signal BANK_ACT.

Referring to FIG. 5, the I/O mode setup unit 41 includes a first node setup unit 411 to set up the voltage level on the first node A by performing a logic summation of the first I/O mode signal X16 and the second I/O mode signal X8. The voltage level on the second node B is based on the voltage level of the second I/O mode signal X8.

Here, the I/O mode signal X16 is a signal which is input at a high level when the operation is set up to the X16 mode and the I/O mode signal X8 is a signal which is input at a high level when the operation is set up to the X8 mode. When the operation is set up to the X32 mode, the I/O mode signals (X16 and X8) are input at a low level.

If the I/O mode is set up to the X32 mode, the I/O mode signals X16 and X8 are input at a low level such that each of the first and second nodes A and B is set up to a low level. If the I/O mode is set up to the X16 mode, the I/O mode signal X16 is input at a high level and the I/O mode signal X8 is input at a low level such that the first and second nodes A and B are set up to high and low levels, respectively. Further, if the I/O mode is set up to the X8 mode, the I/O mode signal X16 is input at a low level and the I/O mode signal X8 is input at a high level such that each of the first and second nodes A and B is set up to a high level.

The driving signal output unit 42 includes a first operation unit ND1 to perform a NAND operation of the address level signal AY<9> and the voltage level signal on the first node A, a second operation unit ND2 to perform a NAND operation of an output signal of the first operation unit ND1 and the voltage level signal on the first node A, a third operation unit ND3 to perform a NAND operation of the address level signal AY<10> and the voltage level signal on the second node B, a fourth operation unit ND4 to perform a NAND operation of an output signal of the third operation unit ND3 and the voltage level signal on the second node B, and a decoding unit 421 to output the driving signals ADEC<0:3> by decoding the output signals of the first to fourth operation units ND1 to ND4 in response to the bank active signal BANK_ACT.

Since the decoding unit 421 outputs the driving signals ADEC<0:3> by decoding the output signals of the first to fourth operation units ND1 to ND4 in response to the bank active signal BANK_ACT, all of the driving signals ADEC<0:3> are output at a low level when the bank active signal BANK_ACT is disabled at a low level and each of the driving signals ADEC<0:3> is selectively output at a high level according to the address level signals AY<9> and AY<10> and the I/O mode signals of X16 and X8 when the bank active signal BANK_ACT is enabled at a high level.

Figure 6:
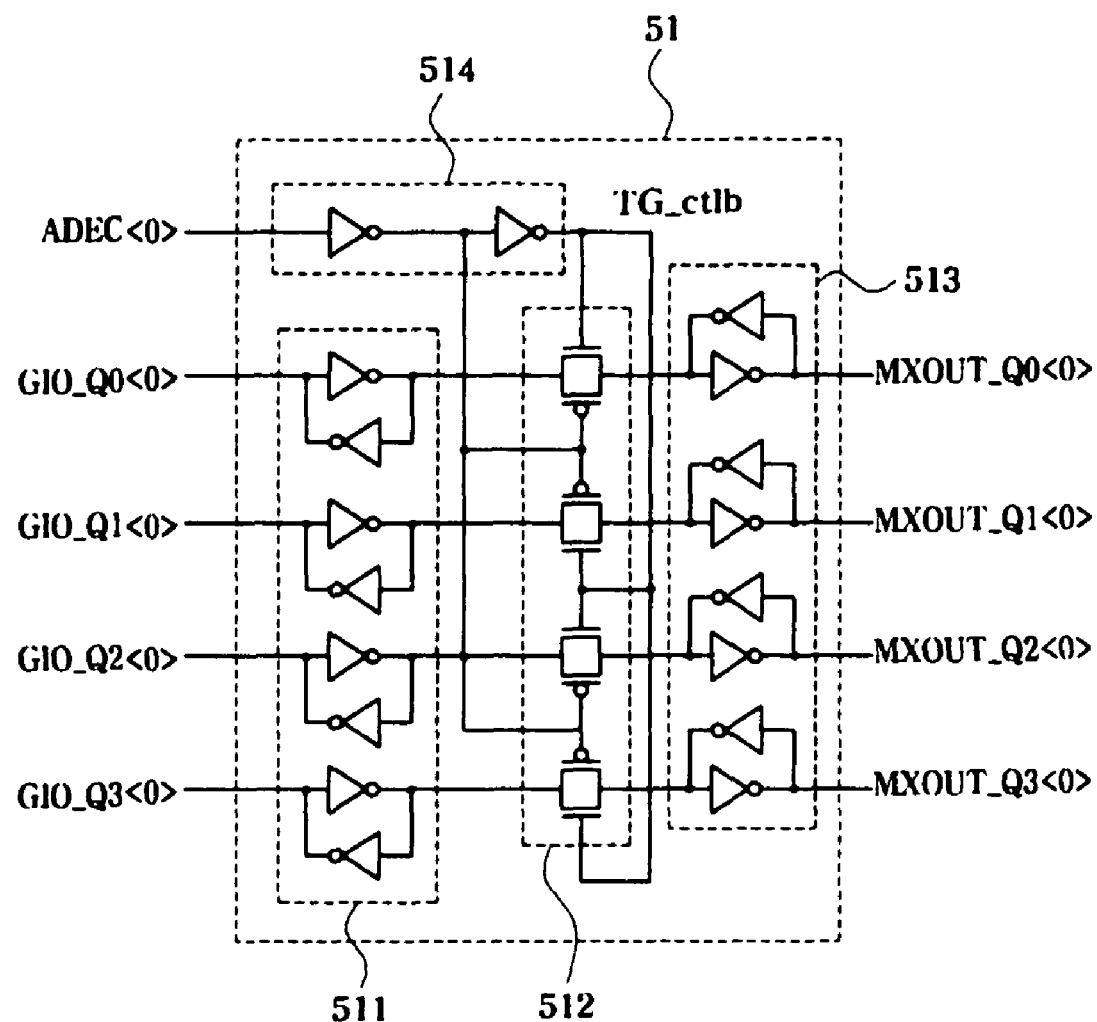
FIG. 6 is a circuit diagram illustrating an example of a data output multiplexing unit in the data output control circuit of FIG. 3.

FIG. 6 is a circuit diagram illustrating an example of the data output multiplexing unit of FIG. 3.

First, referring again to FIG. 3, the data output multiplexing unit 5 includes first to fourth multiplexers 51 to 54 configured to receive the data signals GIO_QX<0:3> on the first to fourth global I/O lines and output first to fourth multiplexing signals MXOUT_QX<0:3>. The first to fourth multiplexers 51 to 54 are driven by the driving signals ADEC<0:3>, respectively.

Referring to FIG. 6, the first multiplexer 51 includes a second latch unit 511 to latch the data signals GIO_Q0<0> to GIO_Q3<0> on the first global I/O line, a third transfer unit 512 to transfer output signals of the second latch unit 511 according to the first driving signal ADEC<0>, and a third latch unit 513 to latch output signals of the third transfer unit 512.

The first multiplexer 51 outputs the data signals GIO_Q0<0> to GIO_Q3<0> on the first to fourth global I/O lines as the first to fourth multiplexing signals MXOUT_Q0<0> to MXOUT_Q3<0> when one of the driving signals ADEC<0:3> (for example, the driving signal ADEC<0>) is input at a high level.

Operations of the above-mentioned configuration will be described below. Operations when the active bank signal BANK_ACT is enabled and disabled will be described.

First, when the active bank signal BANK_ACT is enabled, the driving signal generating unit 4 generates the driving signals ADEC<0:3> for the data output multiplexing unit 5, based on the I/O mode signals X8 and X16 and the address level signal AY<9>. In more detail, when the I/O mode is set up to the X32 mode, the I/O mode signals X16 and X8 are input at a low level so that the first and second nodes A and B are set up to a low level. Therefore, all of the first to fourth operation units ND1 to ND4 output high level signals. As a result, all of the driving signals ADEC<0:3> are output at a high level and all of the first to fourth multiplexers 51 to 54 are driven.

When the I/O mode is set up to the X16 mode, the I/O mode signal X16 is input at a high level and the I/O mode signal X8 is input at a low level so that the first node A is set up to a high level and the second node B is set up to a low level. One of the first and second operation units ND1 and ND2 outputs a level signal which is in phase with the address level signal AY<9> and the other outputs a level signal which is out of phase with the address level signal AY<9>. Each of the third and fourth operation units ND3 and ND4 outputs a high level signal. As a result, two signals of the driving signals ADEC<0:3> are output at a high level and two of the first to fourth multiplexers 51 to 54 are driven.

When the I/O mode is set up to the X8 mode, the I/O mode signal X16 is input at a low level and the I/O mode signal X8 is input at a high level so that the first and second nodes A and B are set up to a high level. One of the first and second operation units ND1 and ND2 outputs a level signal which is in phase with the address level signal AY<9> and the other outputs a level signal which is out of phase with the address level signal AY<9>. One of the third and fourth operation units ND3 and ND4 outputs a level signal which is in phase with the address level signal AY<10> and the other outputs a level signal which is out of phase with the address level signal AY<10>. As a result, one signal of the driving signals ADEC<0:3> is output at a high level and one of the first to fourth multiplexers 51 to 54 is driven.

Next, when the active bank signal BANK_ACT is disabled, the decoding unit 421, which decodes the output signals of the first to fourth operation units ND1 to ND4 in response to the bank active signal BANK_ACT, outputs all of the driving signals ADEC<0:3> at a low level regardless of the I/O mode signals X8 and X16 and the address level signals AY<9> and AY<10>. As a result, since all of the driving signals ADEC<0:3> are output at a low level, all of the first to fourth multiplexers 51 to 54 are not driven.

Although examples and exemplary embodiments of the present invention have been described for illustrative purposes, those skilled in the art will appreciate that various modifications, additions and substitutions are possible, without departing from the scope and spirit of the disclosure and in the accompanying claims.

The present disclosure claims priority to Korean application 10-2008-0061908, flied on Jun. 27, 2008, the entire contents of which are incorporated herein by reference.

What is claimed is:

1. A data output control circuit comprising:
 a driving signal generating unit configured to decode first and second I/O mode signals and first and second address level signals in response to a bank active signal and generate driving signals; and
 a data output multiplexing unit configured to output data signals of global I/O lines as multiplexing signals in response to the driving signals.

2. The data output control circuit of claim 1, wherein the driving signal generating unit includes:
 an I/O mode setup unit configured to set up voltage levels on first and second nodes according to the first and second I/O mode signals; and
 a driving signal output unit configured to decode the first and second address level signals and the voltage levels on the first and second nodes in response to the bank active signal and output the driving signals.

3. The data output control circuit of claim 2, wherein the I/O mode setup unit includes a first node setup unit configured to set up the voltage level on the first node by performing a logic summation of the first and second I/O mode signals and wherein the voltage level on the second node is set up to a voltage level of the second I/O mode signal.

4. The data output control circuit of claim 2, wherein the driving signal output unit includes:
 a first operation unit configured to perform a NAND operation of the first address level signal and a voltage level signal of the first node;
 a second operation unit configured to perform a NAND operation of an output signal of the first operation unit and the voltage level signal of the first node;
 a third operation unit configured to perform a NAND operation of the second address level signal and a voltage level signal of the second node;
 a fourth operation unit configured to perform a NAND operation of an output signal of the third operation unit and the voltage level signal of the second node; and
 a decoding unit configured to decode the output signals of the first to fourth operation units in response to the bank active signal and output the driving signals.

5. The data output control circuit of claim 2, wherein the decoding unit is disabled when the bank active signal is disabled.

6. The data output control circuit of claim 1, wherein the data output multiplexing unit includes a plurality of multiplexers to output the data signals of the global I/O lines as a plurality of multiplexing signals in response to the driving signals.

7. The data output control circuit of claim 1, further comprising an address level signal output unit for outputting the first and second address level signals based on first and second address signals.

8. The data output control circuit of claim 7, wherein the address level signal output unit includes:
- a first signal output unit configured to output the first address level signal based on the first address signal; and
- a second signal output unit configured to output the second address level signal based on the second address signal.

9. The data output control circuit of claim 7, wherein the address level signal output unit includes:
- a first transfer unit configured to transfer the first and second address signals in response to a first signal;
- a latch unit configured to latch an output signal of the first transfer unit;
- a delay unit configured to delay an output signal of the latch unit; and
- a second transfer unit configured to transfer an output signal of the delay unit or the output signal of the latch unit in response to a write enable signal.

10. The data output control circuit of claim 9, wherein the first signal is a voltage level signal which is activated during a column operation of a corresponding bank.

11. A data output control circuit comprising:
- an address level signal output unit configured to output first and second address level signals based on first and second address signals;
- an I/O mode setup unit configured to set up voltage levels of first and second nodes in response to I/O mode signals;
- a driving signal output unit configured to decode the first and second address level signals and the voltage levels of the first and second nodes in response to a bank active signal and generate driving signals; and
- a data output multiplexing unit configured to output data signals of global I/O lines as multiplexing signals in response to the driving signals.

12. The data output control circuit of claim 11, wherein the address level signal output unit includes:
- a first signal output unit configured to output the first address level signal based on the first address signal; and
- a second signal output unit configured to output the second address level signal based on the second address signal.

13. The data output control circuit of claim 11, wherein the address level signal output unit includes:
- a first transfer unit configured to transfer the first and second address signals in response to a first signal;
- a latch unit configured to latch an output signal of the first transfer unit;
- a delay unit configured to delay an output signal of the latch unit; and
- a second transfer unit configured to transfer an output signal of the delay unit or the output signal of the latch unit in response to a write enable signal.

14. The data output control circuit of claim 13, wherein the first signal is a voltage level signal which is activated during a column operation of a corresponding bank.

15. The data output control circuit of claim 11, wherein the I/O mode setup unit includes a first node setup unit configured to set up the voltage level on the first node by performing a logic summation of the first and second I/O mode signals and wherein the voltage level on the second node is set up to a voltage level of the second I/O mode signal.

16. The data output control circuit of claim 11, wherein the driving signal output unit includes:
- a first operation unit configured to perform a NAND operation of the first address level signal and a voltage level signal of the first node;
- a second operation unit configured to perform a NAND operation of an output signal of the first operation unit and the voltage level signal of the first node;
- a third operation unit configured to perform a NAND operation of the second address level signal and a voltage level signal of the second node;
- a fourth operation unit configured to perform a NAND operation of an output signal of the third operation unit and the voltage level signal of the second node; and
- a decoding unit configured to decode the output signals of the first to fourth operation units in response to the bank active signal and output the driving signals.

17. The data output control circuit of claim 16, wherein the decoding unit is disabled when the bank active signal is disabled.

18. The data output control circuit of claim 11, wherein the data output multiplexing unit includes a plurality of multiplexers to output the data signals of the global I/O lines as a plurality of multiplexing signals in response to the driving signals.

* * * * *